United States Patent
Yoo et al.

(10) Patent No.: US 8,293,654 B2
(45) Date of Patent: Oct. 23, 2012

(54) NANOWIRE MEMORY DEVICE AND METHOD OF MANUFACTURING THE SAME

(75) Inventors: Jin-gyoo Yoo, Yongin-si (KR); Cheol-soon Kim, Yongin-si (KR); Jung-hoon Lee, Seoul (KR)

(73) Assignees: Samsung Electronics Co., Ltd., Suwon-si (KR); Seoul National University Industry Foundation, Seoul (KR)

( * ) Notice: Subject to any disclaimer, the term of this patent is extended or adjusted under 35 U.S.C. 154(b) by 0 days.

(21) Appl. No.: 13/425,807

(22) Filed: Mar. 21, 2012

(65) Prior Publication Data
US 2012/0178233 A1 Jul. 12, 2012

Related U.S. Application Data

(62) Division of application No. 12/872,835, filed on Aug. 31, 2010, now Pat. No. 8,184,473, which is a division of application No. 11/714,826, filed on Mar. 7, 2007, now Pat. No. 7,821,813.

(30) Foreign Application Priority Data

Mar. 8, 2006 (KR) .................. 10-2006-0021874

(51) Int. Cl.
*H01L 21/308* (2006.01)
(52) U.S. Cl. ............... 438/706; 257/E51.039; 977/943; 365/151
(58) Field of Classification Search .................. 365/151, 365/129, 244; 257/415, E51.038, E51.039, 257/E51.04; 977/936, 943, 742; 438/706
See application file for complete search history.

(56) References Cited

U.S. PATENT DOCUMENTS

| | | |
|---|---|---|
| 6,536,106 B1 | 3/2003 | Jackson et al. |
| 6,781,166 B2 | 8/2004 | Lieber et al. |
| 6,924,538 B2 | 8/2005 | Jaiprakash et al. |
| 6,944,054 B2 | 9/2005 | Rueckes et al. |
| 7,064,372 B2 | 6/2006 | Duan et al. |
| 2002/0168837 A1 | 11/2002 | Hsu et al. |
| 2002/0180306 A1 | 12/2002 | Hunt et al. |
| 2003/0021966 A1 | 1/2003 | Segal et al. |
| 2004/0238907 A1 | 12/2004 | Pinkerton et al. |
| 2005/0188444 A1 | 8/2005 | Jeong et al. |
| 2005/0279988 A1 | 12/2005 | Bertin |
| 2006/0086958 A1 | 4/2006 | Eimori |
| 2006/0139842 A1 | 6/2006 | Shim et al. |
| 2007/0037414 A1 | 2/2007 | Yamauchi et al. |
| 2007/0132046 A1 | 6/2007 | Yoo et al. |
| 2007/0231988 A1 | 10/2007 | Yoo et al. |
| 2008/0135949 A1 | 6/2008 | Lo et al. |

FOREIGN PATENT DOCUMENTS

| | | |
|---|---|---|
| JP | 2005101363 A | 4/2005 |
| KR | 100434369 A | 11/2002 |
| KR | 1020040092100 A | 11/2004 |

*Primary Examiner* — Douglas King
(74) *Attorney, Agent, or Firm* — Sughrue Mion, PLLC

(57) ABSTRACT

A nanowire memory device and a method of manufacturing the same are provided. A memory device includes: a substrate; a first electrode formed on the substrate; a first nanowire extending from an end of the first electrode; a second electrode formed over the first electrode to overlap the first electrode; and a second nanowire extending from an end of the second electrode corresponding to the end of the first electrode in the same direction as the first nanowire, wherein an insulating layer exists between the first and second electrodes.

19 Claims, 16 Drawing Sheets

NANOWIRE MEMORY DEVICE AND METHOD OF MANUFACTURING THE SAME

CROSS-REFERENCE TO RELATED PATENT APPLICATIONS

This is a Divisional of U.S. application Ser. No. 12/872,835 filed Aug. 31, 2010, which is a Divisional of U.S. application Ser. No. 11/714,826 filed on Mar. 7, 2007 which issued as U.S. Pat. No. 7,821,813 on Oct. 26, 2010, which claims priority from Korean Patent Application No. 10-2006-0021874, filed on Mar. 8, 2006, in the Korean Intellectual Property Office. The entire disclosures of the prior applications are considered part of the disclosure of the accompanying Divisional Application and are hereby incorporated by reference in their entirety.

BACKGROUND OF THE INVENTION

1. Field of the Invention

Apparatuses and methods consistent with the present invention relate to a semiconductor memory device and a method of manufacturing the same, and more particularly, to a memory device having a nanowire as a storage node and a method of manufacturing the same.

2. Description of the Related Art

Recently, most memory devices are fused memory devices having both an advantage of existing as nonvolatile memory devices and volatile memory devices. Examples of fused memory devices include a ferroelectric random access memory (FRAM), a magnetic RAM (MRAM), a phase change RAM (PRAM), and a resistive RAM (RRAM). The difference among the FRAM, the MRAM, the PRAM, and the RRAM can be found in the configuration of a storage node.

As another example of fused memory devices, carbon nanotube memory devices have been introduced. Carbon nanotube memory devices maintain nonvolatile characteristics using carbon nanotubes as a storage node.

Since carbon nanotube memory devices use carbon nanotubes as the storage node, the volume of the storage node can be reduced compared to the FRAM, the MRAM, the PRAM, and the RRAM. In addition, in carbon nanotube memory devices, carbon nanotubes are formed using a composite electric field. Thus, carbon nanotubes can be formed in a correct position.

However, in carbon nanotube memory devices (hereinafter, referred to as related art memory devices), the size of electrodes should be directly reduced so as to reduce a gap between carbon nanotubes and there is a difficulty in performing such a process.

Furthermore, the length of carbon nanotubes should be adjusted so as to increase the yield of operatable cells. However, in conventional memory devices, it is difficult to adjust the length of carbon nanotubes.

Furthermore, in related art memory devices, all electrodes are horizontally arranged on the same plane. Thus, there may be limitations in increasing the degree of integration.

SUMMARY OF THE INVENTION

The present invention provides a nanowire memory device on which a degree of integration of electrodes can be increased, a gap between nanowires can be reduced while the size of the electrodes is not reduced and the length of the nanowires can be reduced in a nanowire memory device manufacturing process.

The present invention also provides a method of manufacturing the nanowire memory device.

According to an aspect of the present invention, there is provided a memory device comprising: a substrate; a first electrode formed on the substrate; a first nanowire extending from an end of the first electrode; a second electrode formed over the first electrode to overlap the first electrode; and a second nanowire extending from an end of the second electrode corresponding to the end of the first electrode in the same direction as the first nanowire, wherein an insulating layer exists between the first and second electrodes.

The substrate may comprise a base substrate and an insulating substrate which are sequentially stacked.

Only portions of the first and second electrodes may overlap.

In addition, the first and second nanowires may be carbon nanotubes.

At least one more set including the first and second electrodes and the first and second nanowires may be further provided on the substrate.

According to another aspect of the present invention, there is provided a memory device comprising: a substrate; first and second lower electrodes formed on the substrate, the first and second lower electrodes being separate from each other by a gap; a first nanowire connecting the first and second lower electrodes; a first upper electrode formed over the first lower electrode to overlap the first lower electrode; a second upper electrode formed over the second lower electrode to overlap the second lower electrode; and a second nanowire connecting the first and second upper electrodes, wherein the first and second upper electrodes are separate from the first and second lower electrodes by a gap having the same distance as the gap between the first and second lower electrodes, and an insulating layer exists between the first lower electrode and the first upper electrode, and between the second lower electrode and the second upper electrode.

According to another aspect of the present invention, there is provided a method of manufacturing a memory device, the method comprising: forming first and second electrodes on a substrate to overlap each other and to be insulated from each other; forming first and second dummy electrodes respectively facing the first and second electrodes on the substrate to overlap each other and to be insulated from each other; forming a first nanowire connecting the first electrode and the first dummy electrode; forming a second nanowire connecting the second electrode and the second dummy electrode; forming a mask covering the first and second electrodes and covering the first and second nanowires; and removing the first and second dummy electrodes and the first and second nanowires that are not covered by the mask, and removing the mask.

The forming of the first and second electrodes may comprises: forming the first electrode on the substrate; forming an insulating interlayer covering the first electrode on the substrate; forming the second electrode on the insulating interlayer; and removing the insulating interlayer around the first and second electrodes.

The removing of the insulating interlayer may further comprise excessively etching a region of the substrate in which the first and second electrodes are not disposed.

The forming of the first and second dummy electrodes on the substrate may comprise: forming a first photoresist layer covering the first and second electrodes on the substrate; forming the first dummy electrode on the first photoresist layer; forming a second photoresist layer covering the first dummy electrode on the first photoresist layer; forming the second dummy electrode on the second photoresist layer; and removing the first and second photoresist layers around the first and second dummy electrodes.

According to another aspect of the present invention, there is provided a method of manufacturing a memory device, the method comprising: forming first and second lower electrodes on a substrate set apart by a gap; forming a first nanowire connecting the first and second lower electrodes; forming a mask covering the first and second lower electrodes and the first nanowire on the substrate; forming a first upper electrode overlapping the first lower electrode and a second upper electrode overlapping the second lower electrode on the mask whereby the first upper second upper electrodes are set apart by a gap having the same distance as the gap between the first and second lower electrodes; forming a second nanowire connecting the first and second upper electrodes; and removing the mask around the first and second upper electrodes.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS

Figure 1:
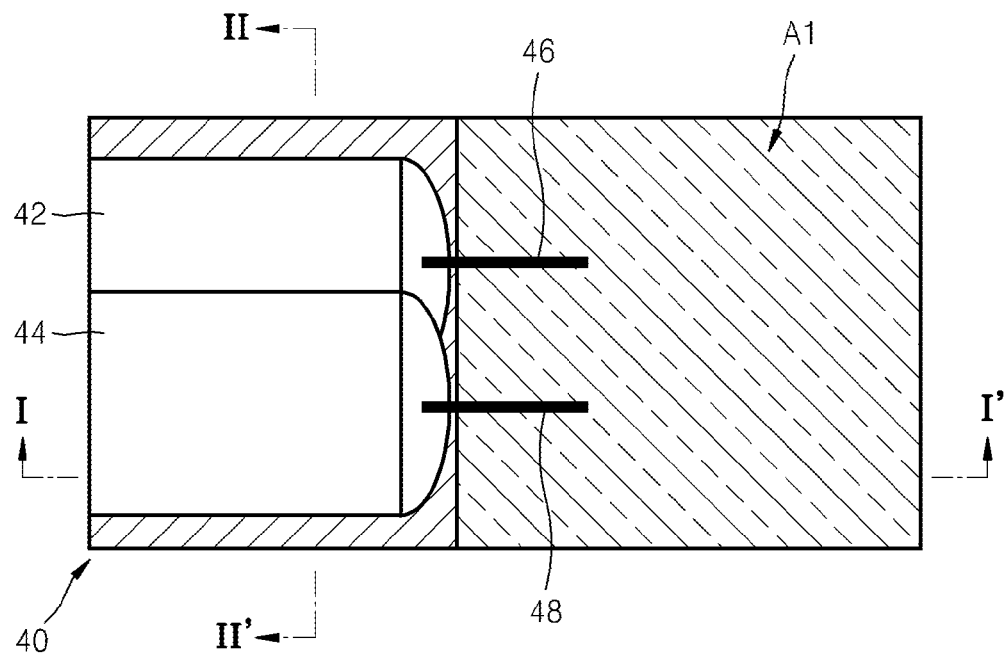
FIG. 1 is a plan view of a nanowire memory device according to an exemplary embodiment of the present invention.

The present invention will now be described more fully with reference to the accompanying drawings, in which exemplary embodiments of the invention are shown. In the drawings, the thickness of layers and regions have been exaggerated for clarity.

First, a nanowire memory device according to an exemplary embodiment of the present invention will now be described.

Figure 2A:
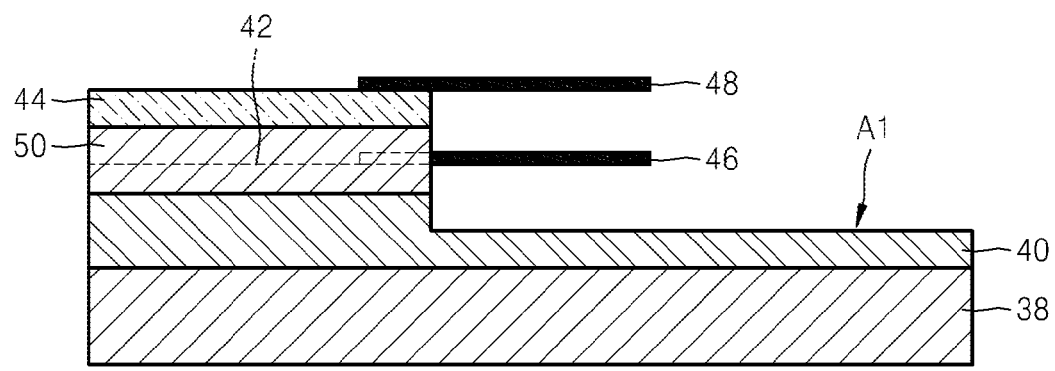
FIG. 2A is a side view taken along line I-I' of FIG. 1 according to an exemplary embodiment of the present invention.
Figure 2B:
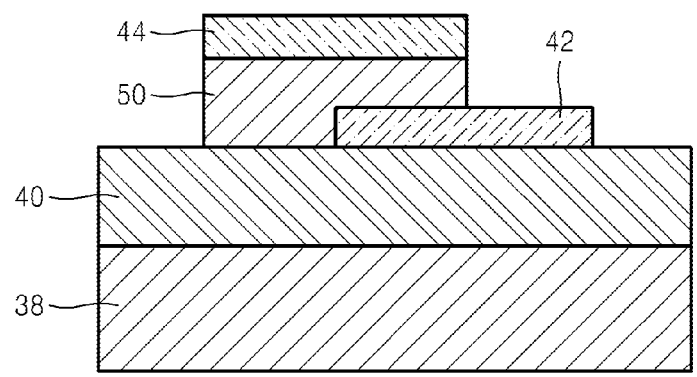
FIG. 2B is a cross-sectional view taken along line II-II' of FIG. 1 according to an embodiment of the present invention.

FIG. 1 is a plan view of the nanowire memory device (hereinafter, referred to as a first memory device) according to an exemplary embodiment of the present invention, FIG. 2A is a side view taken along line I-I' of FIG. 1 according to an exemplary embodiment of the present invention, and FIG. 2B is a cross-sectional view taken along line II-II' of FIG. 1 according to an exemplary embodiment of the present invention.

Referring to FIG. 1, first and second electrodes 42 and 44 are disposed on an insulating substrate 40. The insulating substrate 40 may be a SiO$_2$ substrate, for example. A first region A1 of the insulating substrate 40 is an excessively etched portion formed during a nanowire memory device manufacturing process. A thickness of the insulating substrate 40 of the excessively etched portion is smaller than that of a region where the first and second electrodes 42 and 44 disposed on the insulating substrate 40. The first and second electrodes 42 and 44 may be electrodes formed of Au, for example. The first and second electrodes 42 and 44 may be formed of a chrome layer and an Au layer for excellent adhesion. The first and second electrodes 42 and 44 are parallel to each other. A portion of the second electrode 44 overlaps a portion of the first electrode 42 in the state where the first and second electrodes 42 and 44 are parallel to each other. One end of the first electrode 42 is processed in a round shape. A first nanowire 46 is connected to the round shaped end of the first electrode 42. The first nanowire 46 extends to a predetermined length from the round shaped end of the first electrode 42. One end of the second electrode 44 is processed in a round shape and the round shaped end of the second electrode 44 is in the same direction as the round shaped end of the first electrode 42. A second nanowire 48 is connected to the round shaped end of the second electrode 44. The second nanowire 48 extends to a predetermined length from the round shaped end of the second electrode 44. The length of the second nanowire 48 may be the same as the length of the first nanowire 46. The first and second nanowires 46 and 48 are parallel to each other. The first and second nanowires 46 and 48 may be carbon nanotubes. However, the first and second nanowires 46 and 48 may be other than nanowires such as carbon nanotubes.

Referring to FIGS. 2A and 2B, the insulating substrate 40 is disposed on a base substrate 38. The base substrate 38 may be a semiconductor substrate, for example. A portion of the second electrode 44 is positioned above the first electrode 42. An insulating interlayer 50 is disposed between the first and second electrodes 42 and 44. The insulating interlayer 50 also is disposed between the second electrode 44 and the insulating substrate 40, as illustrated in FIG. 2B. The insulating interlayer 50 may be an SiO$_2$ layer, for example. Due to the insulating interlayer 50, the first and second electrodes 42 and 44 are electrically insulated from each other. However, when the first and second nanowires 46 and 48 contact each other, the first and second electrodes 42 and 44 are electrically connected to each other.

A nanowire memory device (hereinafter, referred to as a second memory device) according to another exemplary embodiment of the present invention will now be described.

Figure 3:
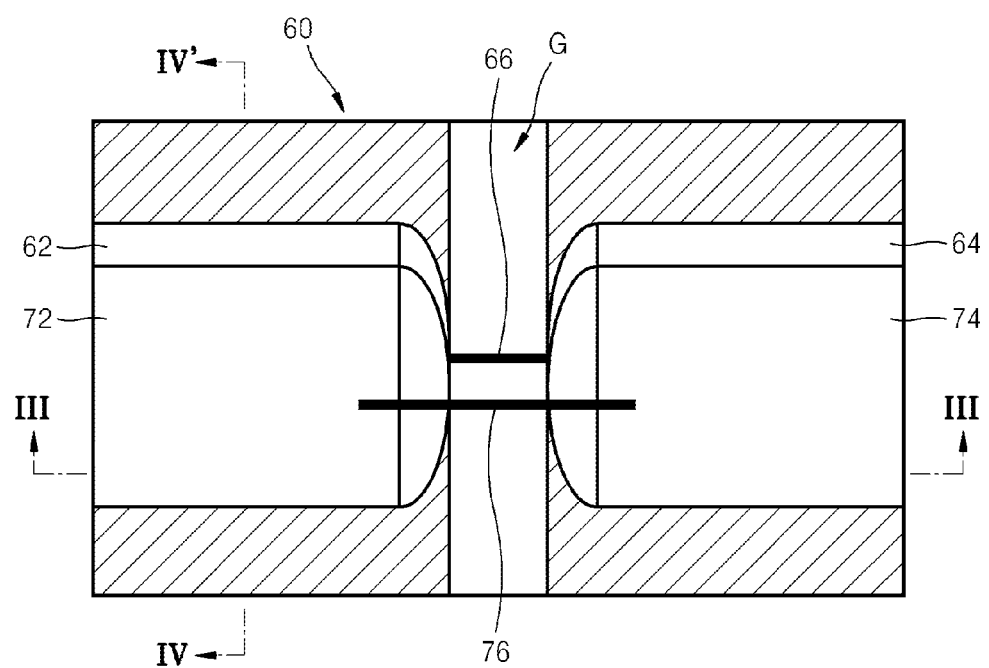
FIG. 3 is a plan view of a nanowire memory device according to another exemplary embodiment of the present invention.
Figure 4A:
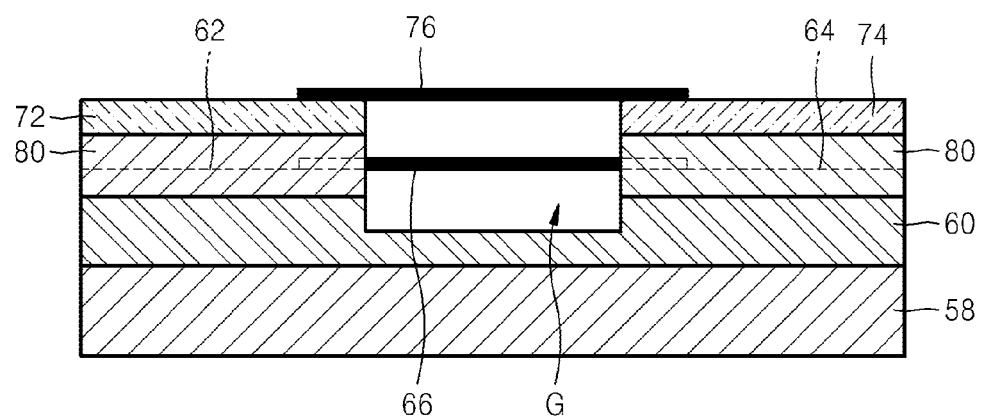
FIG. 4A is a side view taken along line III-III' of FIG. 3 according to another exemplary embodiment of the present invention.
Figure 4B:
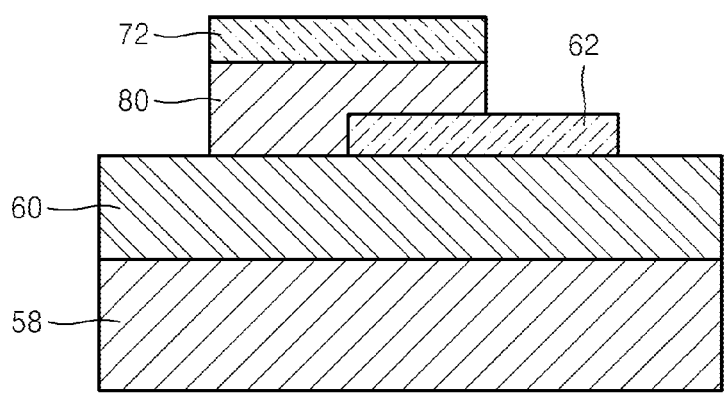
FIG. 4B is a cross-sectional view taken along line IV-IV' of FIG. 3 according to another exemplary embodiment of the present invention.

FIG. 3 is a plan view of a nanowire memory device (hereinafter, referred to as a second memory device) according to another exemplary embodiment of the present invention, FIG. 4A is a side view taken along line III-III' of FIG. 3 according to another exemplary embodiment of the present invention, and FIG. 4B is a cross-sectional view taken along line IV-IV' of FIG. 3 according to another exemplary embodiment of the present invention.

Referring to FIG. 3, first and second lower electrodes 62 and 64 are disposed on an insulating substrate 60. The insulating substrate 60 may be an SiO$_2$ layer, for example. The first and second lower electrodes 62 and 64 face each other and are separate from each other at a predetermined distance. The thickness of the insulating substrate 60 in the portion where the first and second lower electrodes 62 and 64 are not disposed is smaller than that of a portion where the first and second lower electrodes 62 and 64 are disposed (see FIGS. 4A and 4B). This is caused by excessively etching a nanowire memory device during the manufacturing process. The separate first and second lower electrodes 62 and 64 are connected to each other through a first nanowire 66. End portions of the first and second lower electrodes 62 and 64 that are connected to each other via the first nanowire 66 are processed in a round shape. The first nanowire 66 may be the same material as the first and second nanowires 46 and 48 of the first memory device. In addition, material for the first and second lower electrodes 62 and 64 may be the same material as for the first and second electrodes 42 and 44 of the first memory device.

Subsequently, a first upper electrode 72 is positioned over the first lower electrode 62, and a second upper electrode 74 is positioned over the second lower electrode 64. The first lower electrode 62 and the first upper electrode 72 are separate from each other at a predetermined distance. In addition, the second lower electrode 64 and the second upper electrode 74 are separate from each other at a predetermined distance.

The first upper electrode 72 may be of the same shape and material as the first lower electrode 62. In addition, the second upper electrode 74 may be of the same shape and material as the second lower electrode 64. However, a portion of the first upper electrode 72 overlaps a portion of the first lower electrode 62. In addition, a portion of the second upper electrode 74 overlaps a portion of the second lower electrode 64. The distance between the first and second upper electrodes 72 and 74 may be the same ad the distance between the first and second lower electrodes 62 and 64. The separated first and second upper electrodes 72 and 74 are connected to each other via a second nanowire 76. The second nanowire 76 may be the same material as the first nanowire 66.

Referring to FIGS. 4A and 4B, the insulating substrate 60 is disposed on a base substrate 58. A groove G is formed in the insulating substrate 60 (see FIG. 4A). The thickness of the insulating substrate 60 where groove G is formed is smaller than that of other regions. The first and second nanowires 66 and 76 go across the groove G and are separated from the insulating substrate 60. An insulating interlayer 80 is disposed between the first lower electrode 62 and the first upper electrode 72 and between the second lower electrode 64 and the second upper electrode 74. Thus, when the first and second nanowires 66 and 76 are separated from each other, the first lower electrode 62 and the first upper electrode 72 are electrically insulated from each other and the second lower electrode 64 and the second upper electrode 74 are also electrically insulated from each other. The insulating interlayer 80 may be a photoresist layer, for example.

The insulating interlayer 80 is also disposed between a portion of the first upper electrode 72 in which the first upper electrode 72 does not overlap with the first lower electrode 62, and the insulating substrate 60. In addition, the insulating interlayer 80 is also disposed between a portion of the second upper electrode 74 in which the second upper electrode 74 does not overlap with the second lower electrode 64, and the insulating substrate 60.

A method of manufacturing the first and second memory devices will now be described.

First, a method of manufacturing the first memory device will be described.

FIGS. 5 through 13 are cross-sectional views and plan views illustrating a method of manufacturing the nanowire memory device illustrated in FIG. 1 according to an exemplary embodiment of the present invention, wherein lower drawings are plan views and upper drawings are cross-sectional views taken along line B-B' of the plan views.

Figure 5:
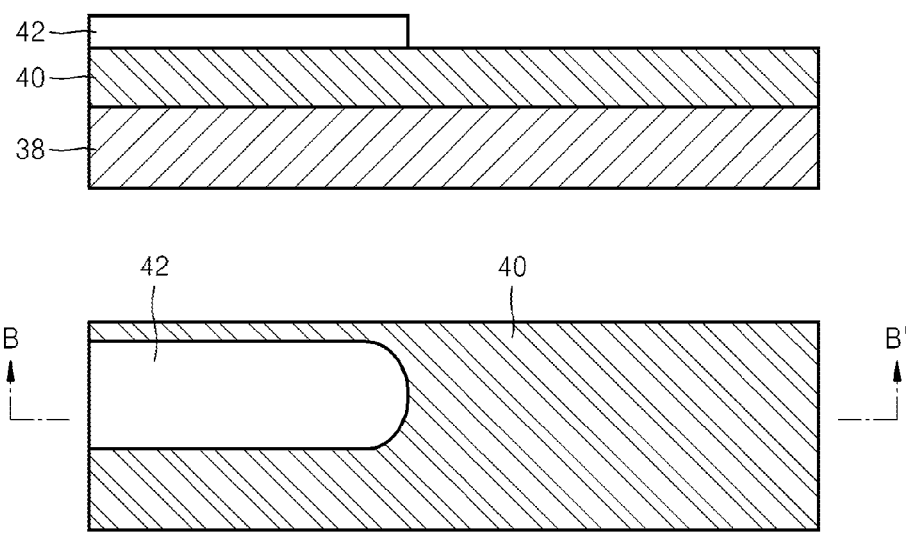
FIGS. 5 through 13 are cross-sectional views and plan views illustrating a method of manufacturing the nanowire memory device illustrated in FIG. 1 according to an exemplary embodiment of the present invention.

Referring to FIG. 5, an insulating substrate 40 is formed on a base substrate 38. The base substrate 38 may be a semiconductor substrate. The insulating substrate 40 may be formed of a silicon oxide film, for example. A first electrode 42 is formed in a predetermined region on the insulating substrate 40. The first electrode 42 may be formed of Au. A chrome layer may be further formed as an adhesion layer (not shown) between the first electrode 42 and the insulating substrate 40. One end of the first electrode 42 is formed in a round shape, as illustrated on the plan view of lower diagram of FIG. 5.

Figure 6:
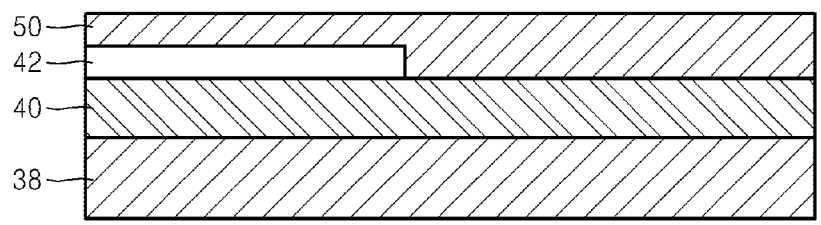
Figure 7:
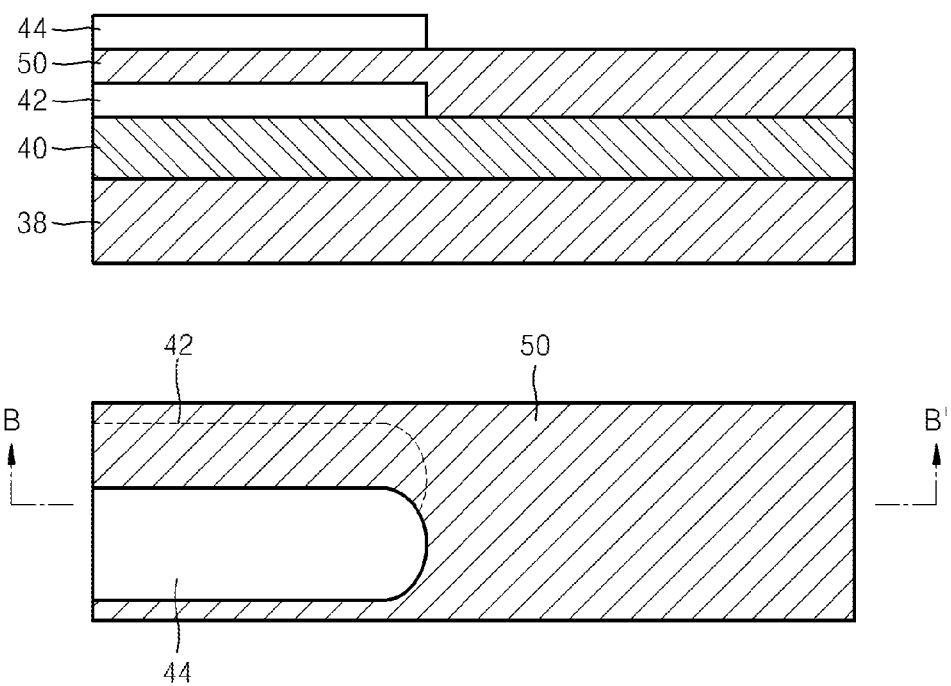

Referring to FIG. 6, an insulating interlayer 50 that covers the first electrode 42 is formed on the insulating substrate 40. The insulating interlayer 50 may be formed of a silicon oxide film, for example. In this exemplary embodiment, the insulating interlayer 50 may be formed using plasma enhanced chemical vapor deposition (PECVD). After a surface of the insulating interlayer 50 is planarized, a second electrode 44 is formed in a predetermined region on the insulating interlayer 50, as illustrated in FIG. 7. The second electrode 44 may be the same shape and material as the first electrode 42. As illustrated by the plan view in the bottom diagram of FIG. 7, the second electrode 44 is formed near the first electrode 42 and a portion of the second electrode 44 overlaps the first electrode 42. Then, an overlap degree may be adjusted. After the second electrode 44 is formed, the insulating interlayer 50 is dry etched at a higher etching rate than the etching rates of the first and second electrodes 42 and 44 until the insulating substrate 40 is exposed.

Figure 8:
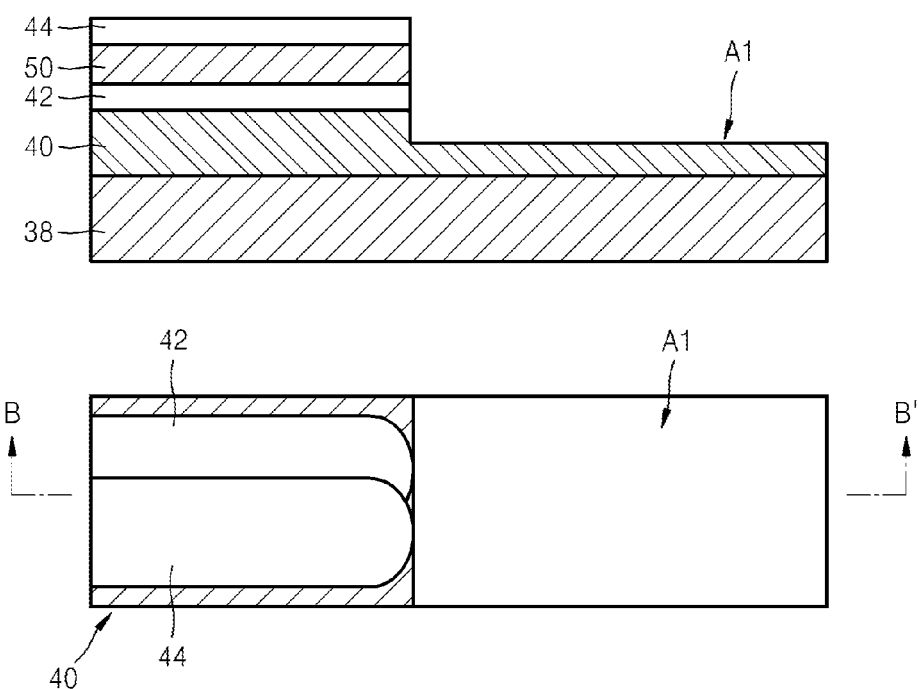

An A1 region of the insulating substrate 40 is excessively etched. As a result, as illustrated in FIG. 8, the thickness of the insulating substrate 40 in the region A1 where the first and second electrodes 42 and 44 are not formed is smaller than that of the region where the first and second electrodes 42 and 44 are formed.

Figure 9:
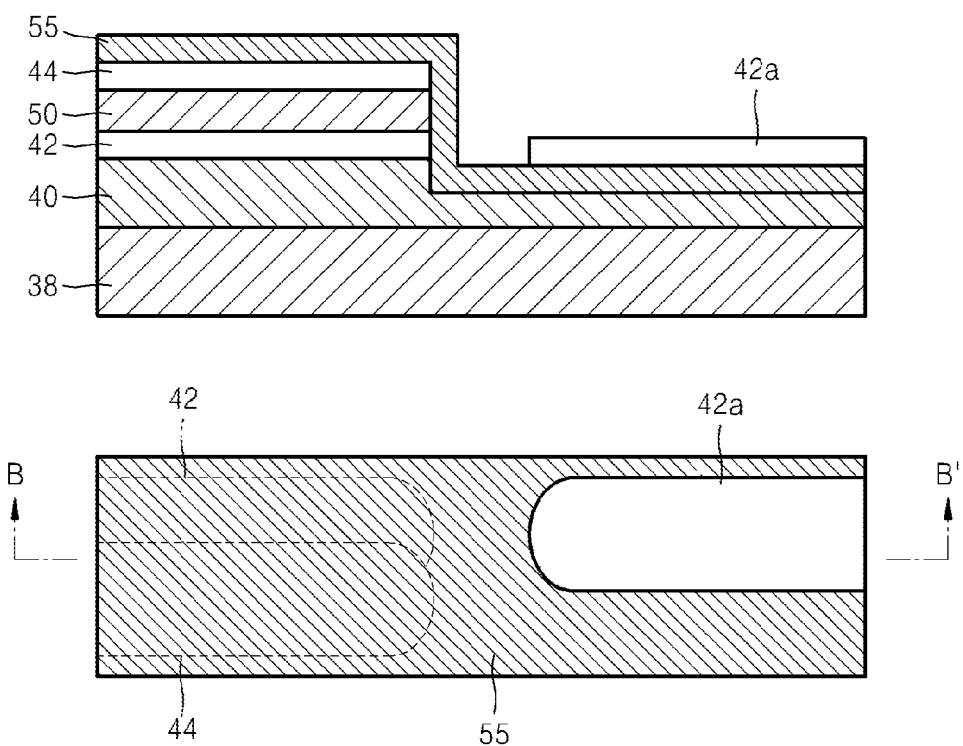

Subsequently, referring to FIG. 9, a first photoresist layer 55 that covers the first and second electrodes 42 and 44 is deposited on the insulating substrate 40. The first photoresist layer is then baked and cured. A first dummy electrode 42a is formed on the cured first photoresist layer 55. The first dummy electrode 42a faces the first electrode 42, as illustrated on the plan view of FIG. 9. In addition, the first dummy electrode 42a is formed in the same shape and of the same material as the first electrode 42.

Figure 10:
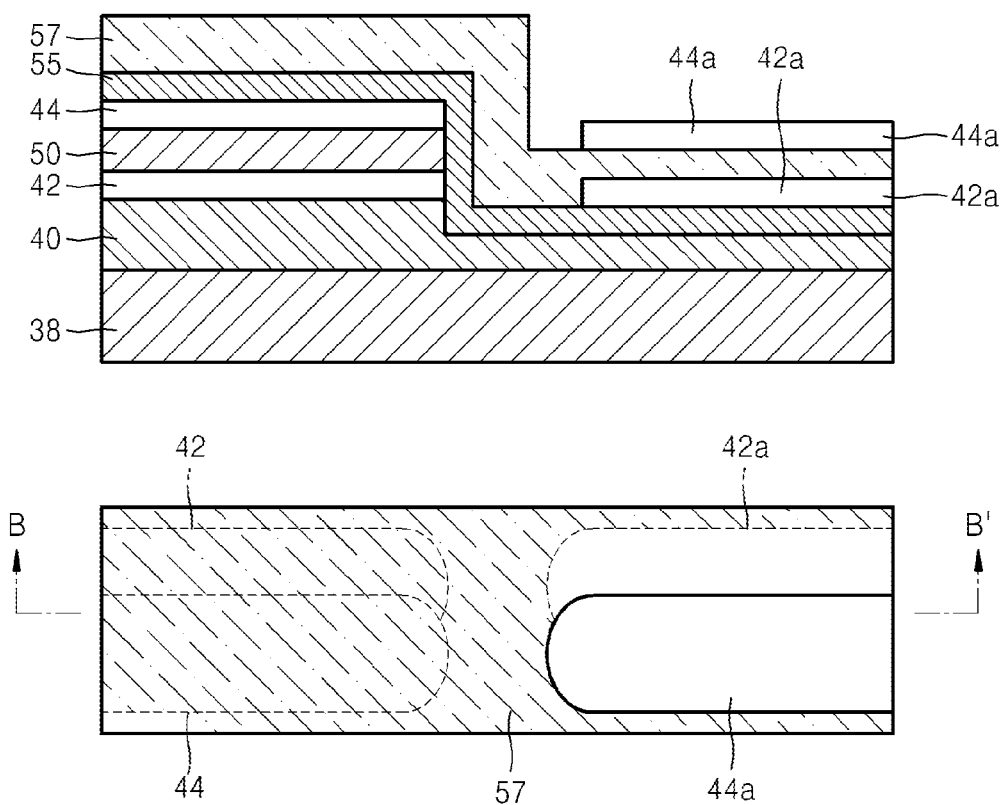

Referring to FIG. 10, a second photoresist layer 57 that covers the first dummy electrode 42a is deposited on the first photoresist layer. Subsequently, the second photoresist layer is baked and cured. A second dummy electrode 44a is formed on the cured second photoresist layer 57. The second dummy electrode 44a may be formed of the same material and in the same shape as the second electrode 44. As a portion of the second electrode 44 overlaps a portion of the first electrode 42, also a portion of the second dummy electrode 44a overlaps a portion of the first dummy electrode 42a. The first and second dummy electrodes 42a and 44a are separated from the first and second electrodes 42 and 44. In addition, the first and second dummy electrodes 42a and 44a face the first and second electrodes 42 and 44 respectively. After the second dummy electrode 44a is formed, the first photoresist layer 55 around the first dummy electrode 42a and the second photoresist layer 57 around the second dummy electrode 44a are exposed and developed.

Figure 11:
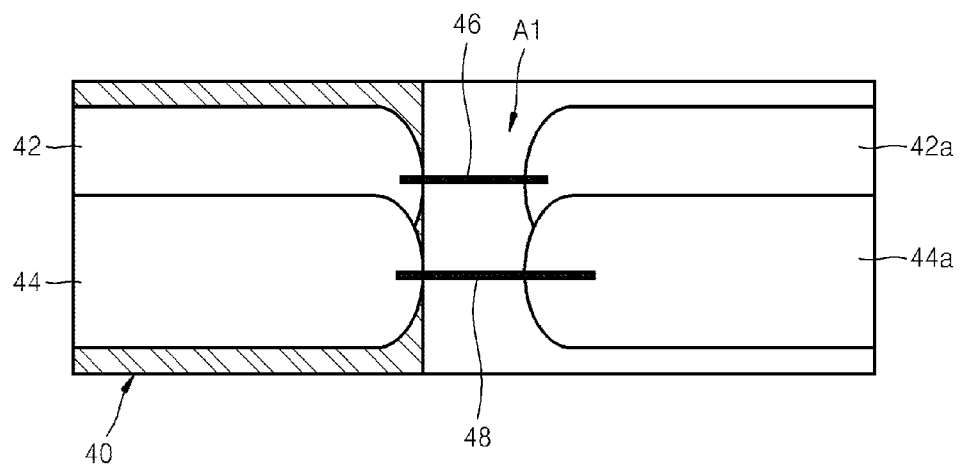

As a result, as illustrated in FIG. 11, the cured first and second photoresist layers 55 and 57 except a portion underneath the first dummy electrode 42a and the second dummy electrode 44a are removed from all regions such that portions of the first and second electrodes 42 and 44 and the first and second dummy electrodes 42a and 44a are exposed. In this state, a first nanowire 46 is formed between the first electrode 42 and the first dummy electrode 42a. In addition, a second nanowire 48 is formed between the second electrode 44 and the second dummy electrode 44a. The first and second nanowires 46 and 48 may be carbon nanotubes other than nanowires. The first and second nanowires 46 and 48 may be formed using a composite electric field. At this time, the first and second nanowires 46 and 48 may be formed to different lengths.

Figure 12:
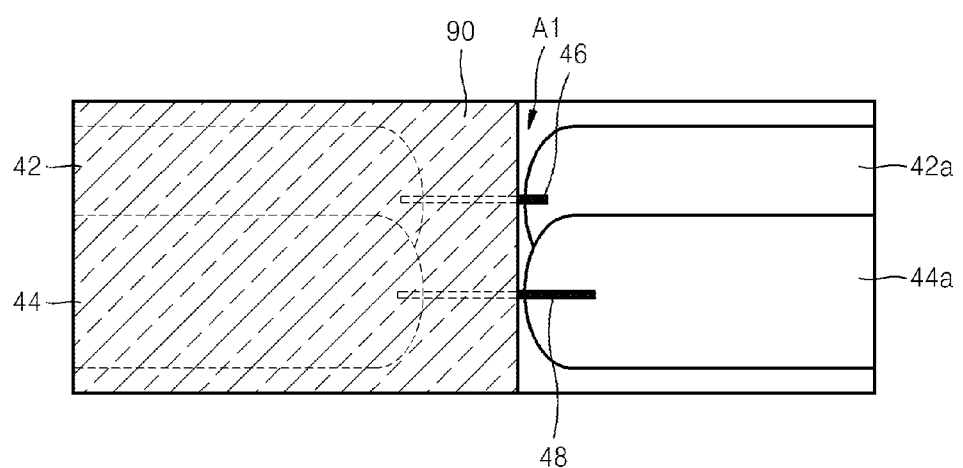
Figure 13:
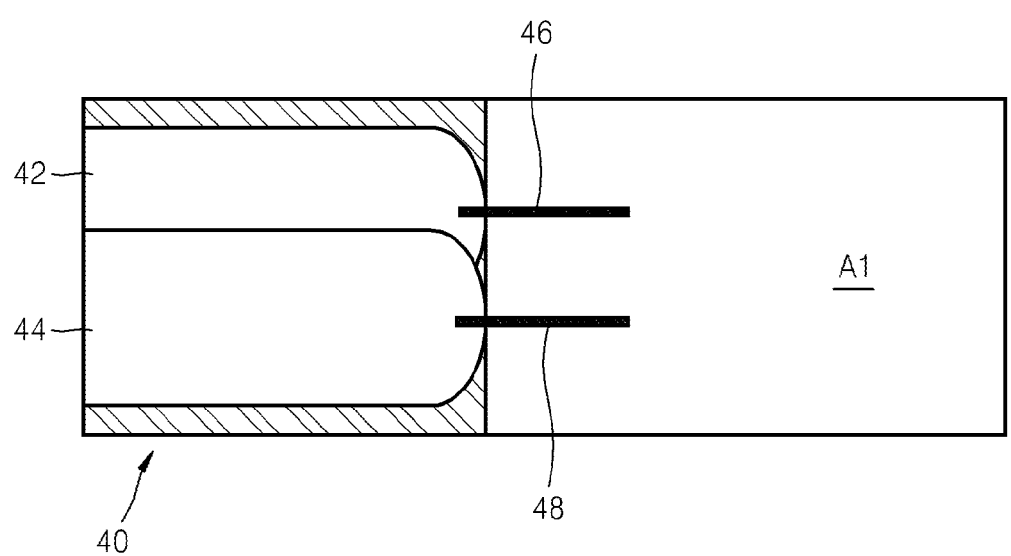

After the first and second nanowires 46 and 48 are formed and in order to make the lengths of the first and second nanowires 46 and 48 the same, a third photoresist layer 90 is deposited to cover the first and second electrodes 42 and 44 and a portion of the first and second nanowires 46 and 48 as illustrated in FIG. 12. In this exemplary embodiment, the third photoresist layer 90 covers the first and second nanowires 46 and 48 so that the first and second nanowires 46 and 48 may be of the same lengths from the first and second electrodes 42 and 44. The exposed first and second dummy electrodes 42a and 44a and the exposed first and second nanowires 46 and 48 are removed using the third photoresist layer 90 as an etch mask. Then, the third photoresist layer 90 is also removed. As a result, as illustrated in FIG. 13, the first and second nanowires 46 and 48 that are connected to the first and second electrodes 42 and 44 are equal in length.

A method of manufacturing the second memory device (see FIG. 3) will now be described.

FIGS. 14 through 19 are cross-sectional views and plan views illustrating a method of manufacturing the nanowire memory device illustrated in FIG. 3 according to another exemplary embodiment of the present invention, wherein lower drawings are plan views and upper drawings are cross-sectional views taken along line B-B' of the plan views.

Figure 14:
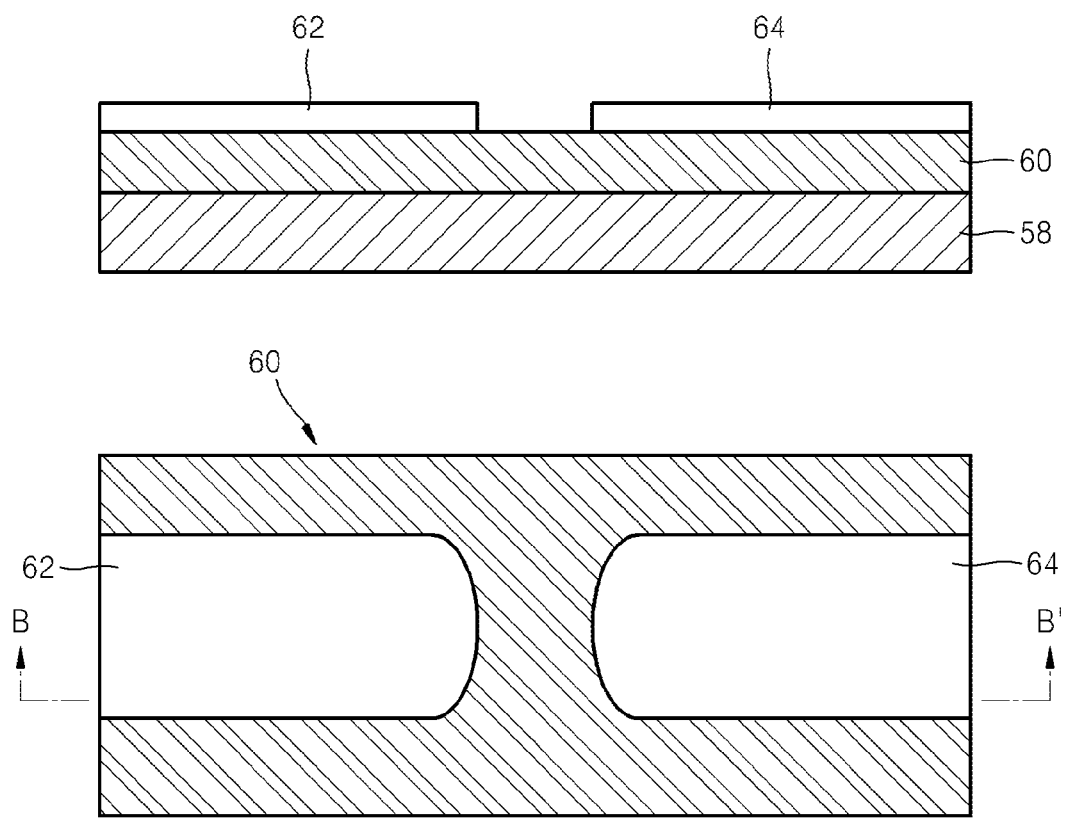
FIGS. 14 through 19 are cross-sectional views and plan views illustrating a method of manufacturing the nanowire memory device illustrated in FIG. 3 according to another exemplary embodiment of the present invention.

Referring to FIG. 14, an insulating substrate 60 is formed on a base substrate 58. The base substrate 58 may be a semiconductor substrate. The insulating substrate 60 may be formed of a silicon oxide film, for example. First and second lower electrodes 62 and 64 are formed on the insulating substrate 60. The first and second lower electrodes 62 and 64 are separate from each other by a predetermined horizontal gap. The first and second lower electrodes 62 and 64 may be formed of a conductive metal, for example, Au. In addition, a chrome layer may also be further formed as an adhesion layer (not shown) between the first and second lower electrodes 62 and 64 and the insulating substrate 60. A portion where the first and second lower electrodes 62 and 64 face each other may be formed in a round shape.

Figure 15:
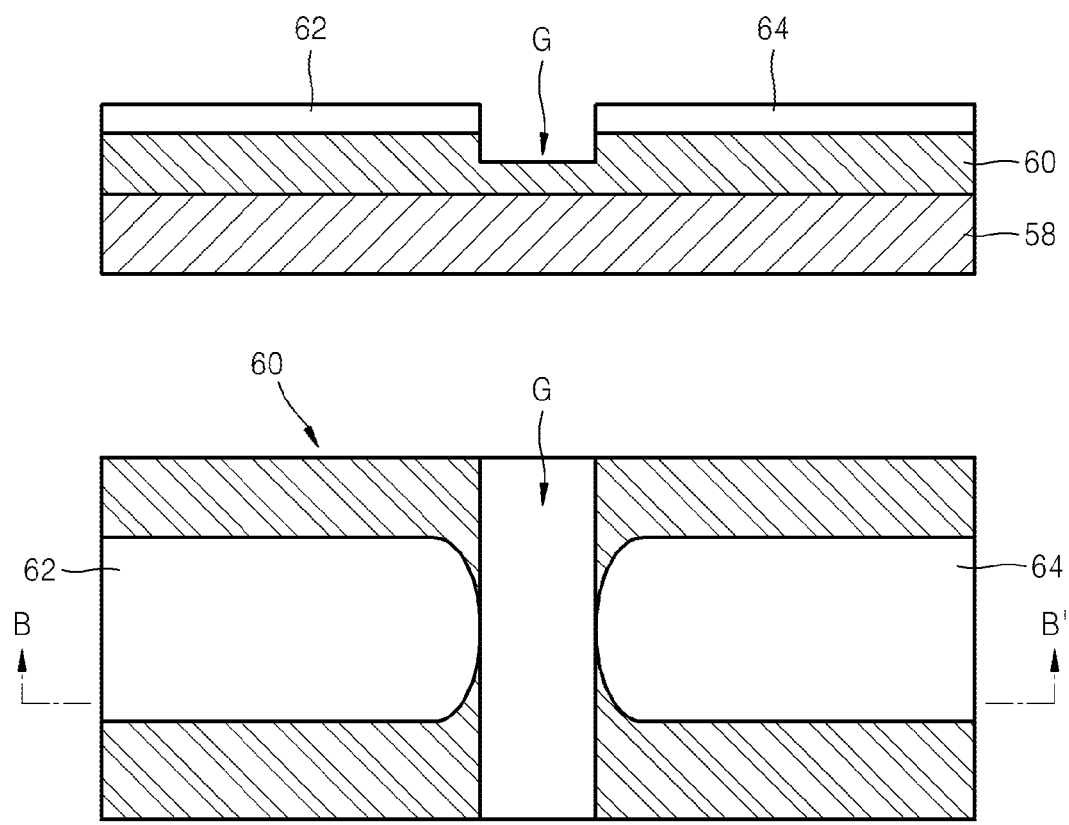

Referring to FIG. 15, a groove G is formed in the insulating substrate 60 between the first and second lower electrodes 62 and 64 by dry etching As a result, the thickness of the insulating substrate 60 where the groove G is formed is smaller than where the first and second lower electrodes 62 and 64 are formed.

Figure 16:
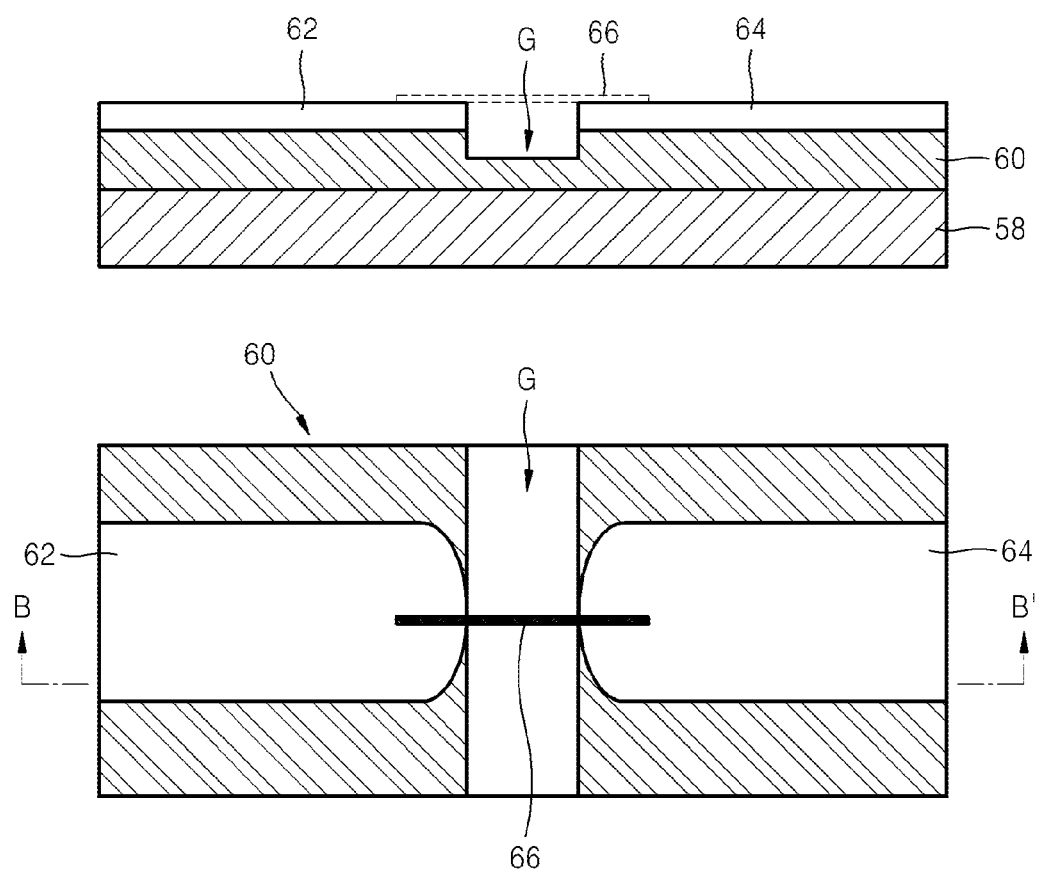

After the groove G is formed, as illustrated in FIG. 16, a first nanowire 66 for connecting the first and second lower electrodes 62 and 64 to each other is formed. The first nanowire 66 may be of the same material as the first nanowire 46 as described in the method of manufacturing the first memory device.

Figure 17:
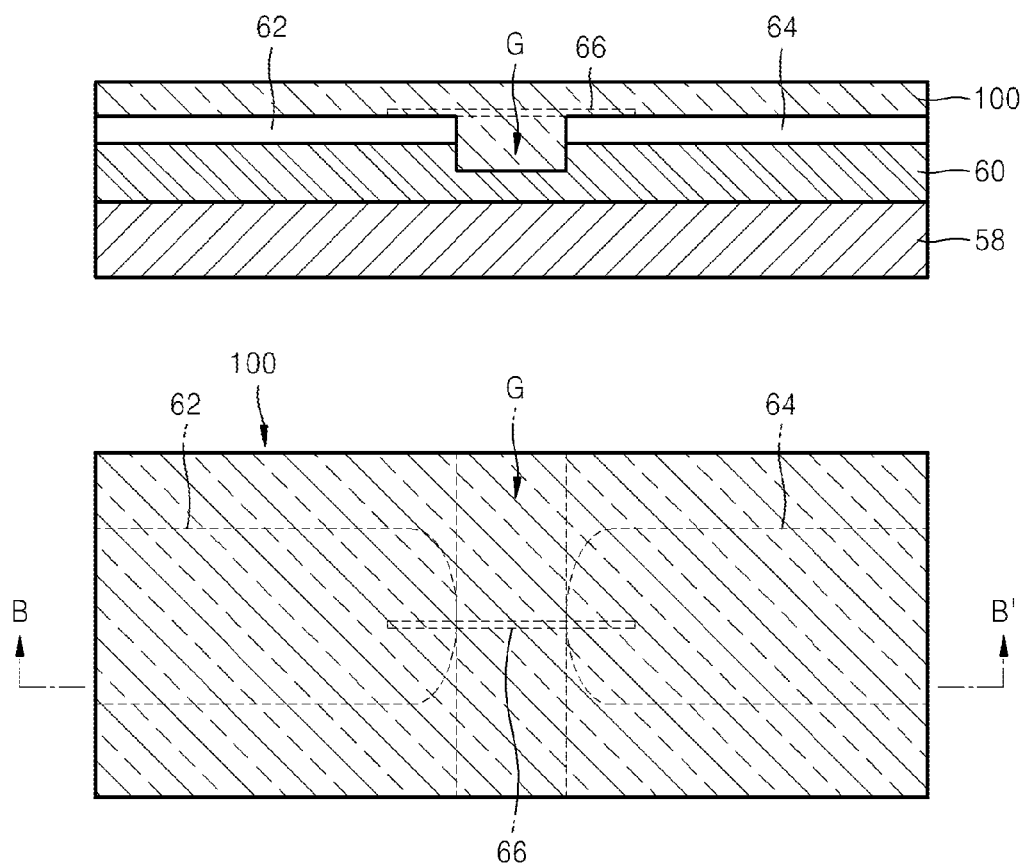

Subsequently, as illustrated in FIG. 17, a photoresist layer 100 that covers the first and second lower electrodes 62 and 64 and the first nanowire 66 is deposited on the insulating substrate 60 and baked so that a cured photoresist layer 100 can be formed.

Figure 18:
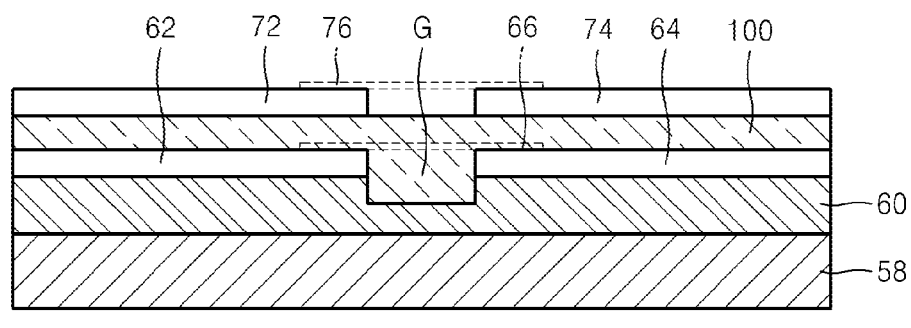
Figure 18:
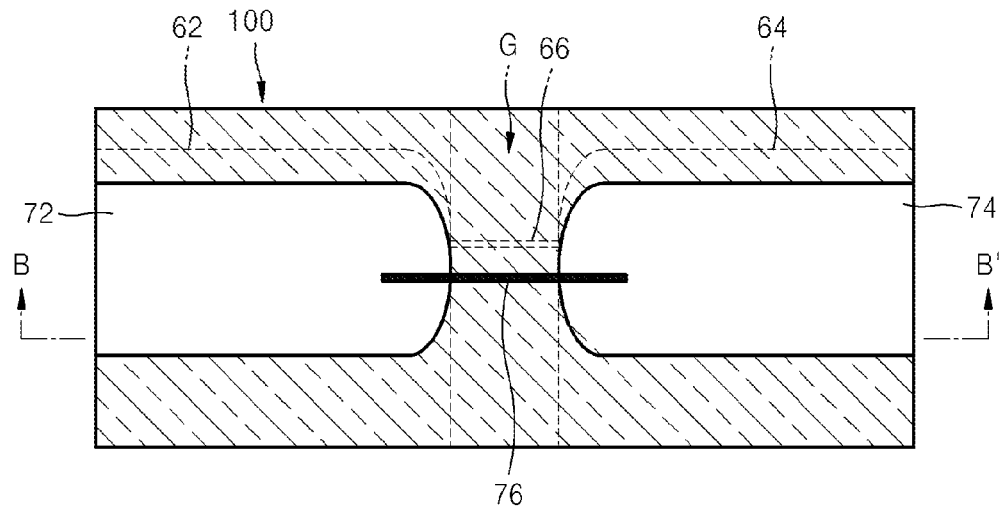
Figure 19:
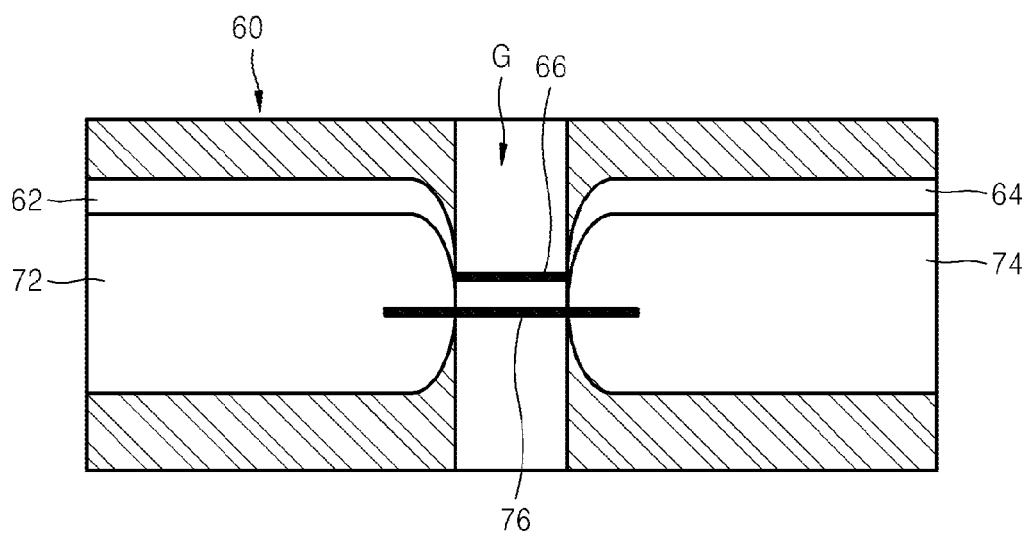

Referring to FIG. 18, the first and second upper electrodes 72 and 74 are formed on the cured photoresist layer 100. The first and second upper electrodes 72 and 74 may be of the same shape and of the same material as the first and second lower electrodes 62 and 64. The first upper electrode 72 is formed over the first lower electrode 62 to be parallel to the first lower electrode 62 so that only a portion of the first upper electrode 72 overlaps the first lower electrode 62. In addition, the second upper electrode 74 is formed over the second lower electrode 64 to be parallel to the second lower electrode 64 so that only a portion of the second upper electrode 74 overlaps the second lower electrode 64. The first and second upper electrodes 72 and 74 are separate from the first and second lower electrodes 62 and 64 by the same gap. The first and second upper electrodes 72 and 74 are connected to each other via a second nanowire 76. The second nanowire 76 may be formed in the same form as the first nanowire 66. Subsequently, a portion of the cured photoresist layer 100 which is exposed by the first and second upper electrodes 72 and 74 is developed and removed. As a result, as illustrated in FIG. 19, the upper and lower electrodes 72 and 62, and 74 and 64 that are vertically stacked so that portions thereof are overlapped, and the first and second nanowires 66 and 76 for connecting the upper electrodes 72 and 74 and lower electrodes 62 and 64, respectively are formed.

The second nanowire 76 may also be formed after the cured photoresist layer 100 is removed.

While many matters have been particularly shown in the above-described exemplary embodiments of the present invention, they should not be construed as being limited to the exemplary embodiments set forth herein; rather, these matters should be construed as an example of exemplary embodiments. For example, one of ordinary skill in the art can arrange the memory device illustrated in FIG. 1 or 3 in the form of an array on a substrate. Furthermore, when electrodes are processed in a different shape than the shape illustrated in FIGS. 1 and 3, it is easy to form nanowires (carbon nanotubes), and if the yield can be increased, the shape of the electrodes can be processed in a different shape. In addition, nanowires can be replaced with a nano structure of carbon nanotubes, for example, carbon nanowires, carbon nanofibers, silicon nanowires or GaAs nanowires, etc. Furthermore, if the thickness of vertically-stacked upper and lower electrodes is sufficient to prevent natural contact between nanowires, the vertically-stacked electrodes can be formed to completely overlap each other.

As described above, in the nanowire memory device and the method of manufacturing the same according to the exemplary embodiments of the present invention, since the nanowires are formed using a composite electric field, the nanowires can be formed in a correct position. As illustrated in FIGS. 1 and 3, since the electrodes are vertically stacked, the degree of integration can be increased compared to a conventional carbon nanotube memory device. Furthermore, since the length of the nanowires for connecting adjacent electrodes can be formed to a predetermined length, the yield of operatable memory cells can be increased. Furthermore, the overlap degree of the vertically-stacked electrodes is adjusted such that a gap between the nanowires can be adjusted.

While the present invention has been particularly shown and described with reference to the exemplary embodiments thereof, it will be understood by those skilled in the art that various changes in form and details may be made therein without departing from the spirit and scope of the invention as defined by the following claims.

What is claimed is:
1. A method of manufacturing a memory device, the method comprising:
  forming first and second electrodes on a substrate to partially overlap each other in a first direction perpendicular to the substrate and to be insulated from each other;

forming first and second dummy electrodes respectively facing the first and second electrodes on the substrate to partially overlap each other in the first direction and to be insulated from each other;

forming a first nanowire extending in a second direction parallel to a top surface of the substrate and connecting the first electrode and the first dummy electrode;

forming a second nanowire parallel to the first nanowire and connecting the second electrode and the second dummy electrode;

forming a mask covering the first and second electrodes and covering the first and second nanowires;

and removing the first and second dummy electrodes and the first and second nanowires that are not covered by the mask, and removing the mask.

2. The method of claim 1, wherein the forming of the first and second electrodes on the substrate comprises:

forming the first electrode on the substrate;

forming an insulating interlayer covering the first electrode on the substrate;

forming the second electrode on the insulating interlayer; and removing the insulating interlayer around the first and second electrodes.

3. The method of claim 2, wherein the removing of the insulating interlayer further comprises excessively etching a region of the substrate in which the first and second electrodes are not disposed.

4. The method of claim 2, wherein the forming of the first and second dummy electrodes on the substrate further comprises:

forming a first photoresist layer covering the first and second electrodes on the substrate;

forming the first dummy electrode on the first photoresist layer;

forming a second photoresist layer covering the first dummy electrode on the first photoresist layer;

forming the second dummy electrode on the second photoresist layer; and removing the first and second photoresist layers around the first and second dummy electrodes.

5. The method of claim 1, wherein the forming of the first and second dummy electrodes on the substrate comprises:

forming a first photoresist layer covering the first and second electrodes on the substrate;

forming the first dummy electrode on the first photoresist layer;

forming a second photoresist layer covering the first dummy electrode on the first photoresist layer;

forming the second dummy electrode on the second photoresist layer; and removing the first and second photoresist layers around the first and second dummy electrodes.

6. The method of claim 1, further comprising forming at least one more set comprising the first and second electrodes and the first and second nanowires.

7. The method of claim 1, wherein the first nanowire has the same length as the second nanowire.

8. The method of claim 1, wherein the substrate comprises a base substrate and an insulating substrate which are sequentially stacked.

9. The method of claim 1, wherein the first and second nanowires are formed using a composite electric field.

10. The method of claim 1, wherein the forming of the first and second electrodes comprises forming the second electrode to overlap a portion of the first electrode.

11. A method of manufacturing a memory device, the method comprising:

forming first and second lower electrodes on a substrate set apart by a gap;

forming a first nanowire extending in a first direction parallel to a top surface of the substrate and connecting the first and second lower electrodes;

forming a mask covering the first and second lower electrodes and the first nanowire on the substrate;

forming a first upper electrode overlapping the first lower electrode in a second direction perpendicular to the substrate and a second upper electrode overlapping the second lower electrode in the second direction on the mask whereby the first upper second upper electrodes are set apart by a gap having the same distance as the gap between the first and second lower electrodes;

forming a second nanowire parallel to the first nanowire and connecting the first and second upper electrodes; and removing the mask around the first and second upper electrodes.

12. The method of claim 11, wherein the substrate comprises a base substrate and an insulating substrate which are sequentially stacked.

13. The method of claim 12, wherein the forming of the first and second lower electrodes comprises forming a groove in the insulating substrate between the first and second lower electrodes.

14. The method of claim 11, wherein the forming of the first upper electrode comprises forming the first upper electrode to overlap a portion of the first lower electrode, and the forming of the second upper electrode comprises forming the second upper electrode to overlap a portion of the second lower electrode.

15. The method of claim 11, wherein the mask is formed of a photoresist layer.

16. The method of claim 11, wherein the first and second nanowires are formed using a composite electric field.

17. The method of claim 11, wherein the removing of the mask is performed prior to the forming of the second nanowire.

18. The method of claim 11, further comprising forming at least one more set comprising the first and second lower electrodes, the first and second upper electrodes, and the first and second nanowires.

19. The method of claim 11, wherein the first nanowire is a carbon nanotube.

* * * * *